US008963657B2

(12) United States Patent
Mina et al.

(10) Patent No.: US 8,963,657 B2
(45) Date of Patent: Feb. 24, 2015

(54) ON-CHIP SLOW-WAVE THROUGH-SILICON VIA COPLANAR WAVEGUIDE STRUCTURES, METHOD OF MANUFACTURE AND DESIGN STRUCTURE

(75) Inventors: Essam Mina, South Burlington, VT (US); Guoan Wang, South Burlington, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 13/156,935

(22) Filed: Jun. 9, 2011

(65) Prior Publication Data

US 2012/0313736 A1 Dec. 13, 2012

(51) Int. Cl.
| | |
|---|---|
| H01P 3/08 | (2006.01) |
| G06F 17/50 | (2006.01) |
| H01L 21/768 | (2006.01) |
| H01L 23/48 | (2006.01) |
| H01P 3/00 | (2006.01) |

(52) U.S. Cl.
CPC .............. *H01L 23/481* (2013.01); *H01P 3/003* (2013.01); *H01L 2924/0002* (2013.01)
USPC ......................................................... 333/238

(58) Field of Classification Search
CPC ............ H01P 3/003; H01P 3/02; H01P 3/026
USPC ........................................ 333/238, 239, 248
See application file for complete search history.

(56) References Cited

U.S. PATENT DOCUMENTS

| | | | |
|---|---|---|---|
| 4,611,184 A | 9/1986 | Kumar | |
| 4,945,321 A | 7/1990 | Oppelt et al. | |
| 5,926,077 A | 7/1999 | Milroy | |
| 6,137,383 A | 10/2000 | De Lillo | |
| 6,207,903 B1 | 3/2001 | Wen et al. | |
| 6,501,415 B1 | 12/2002 | Viana et al. | |
| 6,617,943 B1 | 9/2003 | Fazelpour | |
| 6,765,458 B2 | 7/2004 | Yamaguchi | |
| 6,985,055 B2 * | 1/2006 | Minami | 333/238 |
| 7,053,729 B2 | 5/2006 | Aguirre et al. | |
| 7,142,074 B2 | 11/2006 | Kim et al. | |
| 7,170,373 B2 | 1/2007 | Ito et al. | |
| 7,192,530 B2 | 3/2007 | Ryu et al. | |

(Continued)

FOREIGN PATENT DOCUMENTS

EP    0997965    3/2000

OTHER PUBLICATIONS

International Search Report for application PCT/US2012/028859, date of mailing—Sep. 25, 2012, 5 pages.
Written Opinion of the International Searching Authority for application PCT/US2012/028859, date of mailing—Sep. 25, 2012, 5 pages.
Chiu et al., "A Novel Planar Three-Way Power Divider", IEEE Microwave and Wireless Components Letters, vol. 16, No. 8, Aug. 2006, pp. 449-451.

(Continued)

*Primary Examiner* — Stephen Jones
*Assistant Examiner* — Scott S Outten
(74) *Attorney, Agent, or Firm* — Anthony Canale; Roberts Mlotkowski Safran & Cole, P.C.

(57) ABSTRACT

On-chip, high performance, slow-wave coplanar waveguide with through-silicon via structures, method of manufacture and design structures for integrated circuits are provided herein. The method includes forming at least one ground plane layer in a substrate and forming a signal layer in the substrate, in a same plane layer as the at least one ground. The method further includes forming at least one metal filled through-silicon via between the at least one ground plane layer and the signal layer.

22 Claims, 5 Drawing Sheets

(56) References Cited

U.S. PATENT DOCUMENTS

| | | |
|---|---|---|
| 7,242,266 B2 | 7/2007 | Peterson |
| 7,518,473 B2 | 4/2009 | Ni |
| 7,626,476 B2 | 12/2009 | Kim et al. |
| 7,812,694 B2 | 10/2010 | Ding et al. |
| 8,143,974 B2 | 3/2012 | Makita |
| 2005/0040915 A1 | 2/2005 | Ryu et al. |
| 2006/0264029 A1 | 11/2006 | Heck et al. |
| 2007/0042563 A1 | 2/2007 | Wang et al. |
| 2007/0109070 A1 | 5/2007 | Singh |
| 2007/0222512 A1 | 9/2007 | Krishnamurthy et al. |
| 2009/0251232 A1* | 10/2009 | Ding et al. .................. 333/1 |
| 2010/0047967 A1 | 2/2010 | Lim et al. |
| 2010/0079222 A1 | 4/2010 | Makita |
| 2010/0148333 A1 | 6/2010 | Tang |
| 2010/0158441 A1* | 6/2010 | Mickelson et al. .......... 385/37 |
| 2010/0225425 A1 | 9/2010 | Cho |

OTHER PUBLICATIONS

Scardelletti et al., "Miniaturized Wilkinson Power Dividers Utilizing Capacitive Loading", IEEE Microwave and Wireless Components Letters, vol. 12, No. 1, Jan. 2002, pp. 6-8.

Cho et al., "Novel Broadband Through Silicon Via Interconnect for Three Dimensional CPW Transition", Proceedings of the 40th European Microwave Conference, Sep. 28-30, 2010, pp. 113-116.

Wojnowski et al., "Electrical Characterization of 3D Interconnection Structures up to Millimeter Wave Frequencies", IEEE, 2008 10th Electronics Packaging Technology Conference, pp. 1393-1402.

Hu et al., "THz-Wave Propagation Characteristics of TSV-Based Transmission Lines and Interconnects", IEEE, 2010 Electronic Components and Technology Conference, pp. 46-50.

Pak et al., "Slow Wave and Dielectric Quasi-TEM Modes of Metal-Insulator-Semiconductor (MIS) Structure Through Silicon Via (TSV) in Signal Propagation and Power Delivery in 3D Chip Package", IEEE, 2010 Electronic Components and Technology Conference, pp. 667-672.

\* cited by examiner

ON-CHIP SLOW-WAVE THROUGH-SILICON VIA COPLANAR WAVEGUIDE STRUCTURES, METHOD OF MANUFACTURE AND DESIGN STRUCTURE

FIELD OF THE INVENTION

The invention generally relates to waveguide structures and, in particular, to on-chip slow-wave coplanar waveguide through-silicon via structures, methods of manufacture and design structures for integrated circuits.

BACKGROUND

In circuit design, passive components refer to components that are not capable of power gain such as, for example, capacitors, inductors, resistors, diodes, transmission lines and transformers. In circuit design for communications systems, for example, a large area of the board is taken up by passive devices. For example, 90-95% of components in a cellular telephone are passive components, taking up approximately 80% of the total transceiver board, which accounts for about 70% of the cost. To reduce the space taken up by the passive devices, very small discrete passive components and the integration of the passive components are under development.

Multi-chip module, system on chip (SOC)/system on package (SOP) in which the passives and interconnects are incorporated into the carrier substrate offer an attractive solution to further increase the integration. For example, SOC is a fully integrated design with RF passives and digital and analog circuits on the same chip. Their operation on CMOS grade silicon, however, is degraded by the high loss of transmissions lines and antennas. On the other hand, BiCMOS technologies present a cost effective option to realize highly integrated systems combining analog, microwave design techniques, transmission lines and other passive components.

In any event, many efforts have been made to reduce the size of the passive devices. For example, to reduce the space taken up by the passive components, discrete passive components have been replaced with on-chip passive components. However, size reduction of passive components may depend at least in part on the further development of on-chip interconnects, such as slow-wave coplanar waveguide (CPW) structures, for microwave and millimeter microwave integrated circuits (MICs), microwave and millimeter monolithic microwave integrated circuits (MMICs), and radiofrequency integrated circuits (RFICs) used in communications systems. In particular, interconnects that promote slow-wave propagation can be employed to reduce the sizes and cost of distributed elements to implement delay lines, variable phase shifters, branchline couplers, voltage-tunable filters, etc. However, advanced coplanar waveguide structures are needed for radio frequency and microwave integrated circuits to serve as interconnects that promote slow-wave propagation, as well as related design structures for radio frequency and microwave integrated circuits.

Accordingly, there exists a need in the art to overcome the deficiencies and limitations described hereinabove.

SUMMARY

In a first aspect of the invention, a method of forming a coplanar waveguide structure comprises forming at least one ground plane layer in a substrate and forming a signal layer in the substrate, in a same plane layer as the at least one ground. The method further comprises forming at least one metal filled through-silicon via between the at least one ground plane layer and the signal layer.

In an another aspect of the invention, a method of tuning a coplanar waveguide structure comprises tuning at least one of a capacitance and characteristic impedance of the coplanar waveguide structure by adjusting a through-silicon via filled with metal. The through-silicon via is positioned between a signal layer and a ground plane layer formed in a substrate.

In yet another aspect of the invention, a slow wave waveguide (CPW) structure comprises a signal layer and at least one ground plane layer adjacent to the signal layer. The structure further comprises at least one through-silicon via filled with metal, and which is positioned between the signal layer and the at least one ground plane layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the coplanar waveguide structure (CPW), which comprises the structures of the present invention. In still further embodiments, a method in a computer-aided design system is provided for generating a functional design model of the CPW. The method comprises generating a functional representation of the structural elements of the CPW.

More specifically, a hardware description language (HDL) design structure encoded on a machine-readable data storage medium is provided. The HDL design structure comprises elements that when processed in a computer-aided design system generates a machine-executable representation of a coplanar waveguide structure. The HDL design structure comprises a signal layer and at least one ground plane layer adjacent to the signal layer. The structure further comprises at least one through-silicon via filled with metal, and which is positioned between the signal layer and the at least one ground plane layer.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

Figure 1:
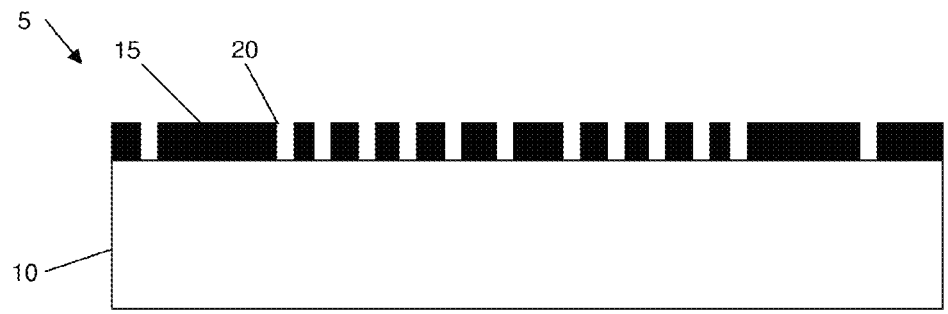
FIGS. 1 and 2 show fabrication processes and respective structures in accordance with aspects of the invention.

The invention generally relates to waveguide structures and, in particular, to on-chip slow-wave coplanar waveguide through-silicon via structures, methods of manufacture and design structures for integrated circuits. More specifically, the present invention relates to on-chip slow-wave through-silicon via coplanar waveguide (CPW) structures. In embodiments, the present invention provides a compact on-chip CPW structure that has more design flexibility to achieve improved slow-wave effects, compared to conventional structures. For example, the present invention provides ideal on-chip slow-wave structures with low losses and improved characteristic impedance. Advantageously, the CPW structure can be fabricated using conventional CMOS fabrication technology using current standard semiconductor processes.

In embodiments, the CPW structures of the present invention include a signal layer and ground plane layer comprising one or more through-silicon vias, where each via can have certain dimensions and spacing there between. In embodiments, the CPW structure also includes, for example, through-silicon vias filled with metal, formed between the signal layer and the ground plane layer. Capacitance and characteristic impedance of the CPW structure of the present invention can be adjusted by positioning the through-silicon vias filled with metal at different locations between the signal layer and ground plane layer, or by changing the dimensions (characteristics) of the through-silicon vias, e.g., achieving variable electrical length.

For example, placing the through-silicon vias between the signal layer and ground plane layer will increase the capacitance and change the characteristic impedance of the CPW structure. Moreover, increasing the metal proportions of the through-silicon vias will increase the capacitance of the CPW structure. Specifically, the capacitance of the CPW structure can be increased by connecting two or more through-silicon vias, or by increasing the dimensions of the vias filled with the metal. Thus, for example, slow-wave effect can be improved by connecting the two or more through-silicon vias (metal slots). Accordingly, in embodiments, the CPW structures of the present invention can be adjusted by using different dimensions, different separations, and/or adding additional metal slots forming the through-silicon vias filled with metal. That is, the slow-wave effect of the CPW structures can be tuned by, for example, (i) changing the separation between the signal layer and the through-silicon vias filled with metal;
(ii) changing the thicknesses of the through-silicon vias filled with metal;
(iii) adding additional metal slots comprising the through-silicon vias; and/or
(iv) connecting the through-silicon vias filled with metal, with connecting vias.

Accordingly, and advantageously, the CPW structures can be implemented for any characteristic impedance.

By way of background, from the transmission line theory, the wavelength, phase velocity and characteristics impedance are given respectively as:

$$\lambda = \frac{v}{f} \quad (1)$$

$$v \propto \frac{1}{\sqrt{LC}} \quad (2)$$

$$Zo = (L/C)^{1/2} \quad (3)$$

where f is the wave's frequency, L and C are the inductance and capacitance per unit length, respectively, v is the magnitude of phase velocity and $\lambda$ is the wavelength.

From the above equations, the wavelength can be made smaller while the characteristic impendence is kept unchanged by increasing L and C with the same ratio. Also, increasing either or both the inductance L and/or capacitance C will decrease the velocity v and hence the wavelength $\lambda$. And, decreasing the wavelength $\lambda$ will physically reduce the dimension of passive components such as branchline coupler which includes four quarter wavelength arms, thereby reducing the chip space needed for the CPW structure and components built with them.

Figure 2:
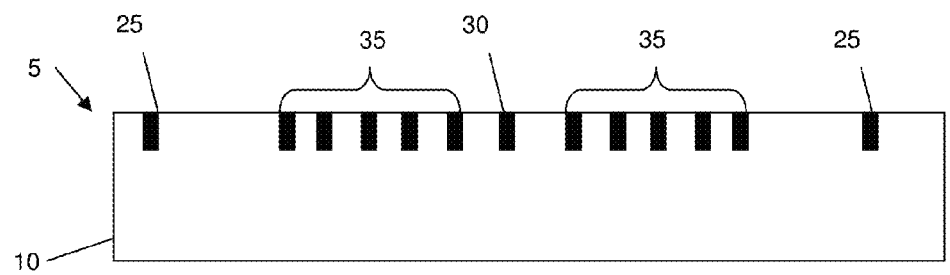

FIGS. 1 and 2 show fabrication processes and respective structures in accordance with aspects of the invention. More specifically, FIG. 1 shows a beginning structure 5 comprising a substrate 10. In embodiments, the substrate 10 is composed of silicon; although, other substrates are also contemplated by the present invention. For example, the substrate 10 can be a material such as, for example, a silicon based material. A resist 15 is formed on the substrate 10, and is patterned using conventional photolithography processes to form a plurality of openings 20. For example, in embodiments, the resist can be exposed to light to form the openings 20, using conventional CMOS processes. The openings 20 shown in FIG. 1 are provided as a non-limited illustrative example, such that other patterns are also contemplated by the present invention as shown, e.g., in FIGS. 3, 4 and 5A-5D.

In FIG. 2, the structure 5 undergoes additional CMOS fabrication processing to form a plurality of metal slots, e.g., structures, 25, 30 and 35, in accordance with the present invention. More specifically, a reactive ion etching (RIE) process is used to form through-silicon vias in the substrate 10. In embodiments, the through-silicon vias can have varying dimensions and spacing. For example, the through-silicon vias can be about 3 microns to about 100 microns in width (thickness), with similar spacing therebetween (e.g., silicon width between the vias). For example, in embodiments, the through-silicon vias can have a 3 micron width, with a 100 micron spacing therebetween, or other combinations thereof. In embodiments, the depth of the vias may be about 10 microns to about 50 microns, and the length of each via can be about 150 microns to about 300 microns. It should be understood, though, that other dimensions are also contemplated by the present invention, depending on the technology and desired capacitance.

The through-silicon vias are filled with a metal or metal alloy to form metal slots (also referred to as plates), e.g., structures 25, 30 and 35. The metal alloy can be deposited using conventional deposition processes such as, for example, atomic layer deposition (ALD), metal sputtering, or a chemical vapor deposition (CVD), amongst other deposition methods. The metal or metal alloy can be any known metal or metal alloy, suitable for its particular purpose, e.g., tungsten In embodiments, an insulator material such as, for example, SiO$_2$, can be deposited on the sidewalls of the through-silicon vias, prior to the deposition of the metal or metal alloy. In embodiments, the insulator material can be about 1 micron in thickness.

In embodiments, the metal slots, e.g., metal structures, form a metal ground plane layer 25, a metal signal layer 30, and one or more through-silicon via metal layer 35. In this and other embodiments, the metal ground plane layer 25, metal signal layer 30, and one or more through-silicon via metal layer 35 can be parallel metal slots, in a same plane and coplanar. In embodiments, the one or more through-silicon via metal layer 35 is composed of floating silicon via metal slots positioned between the metal ground plane layer 25 and the signal layer 30. In embodiments, though, the present invention also contemplates connected through-silicon via metal layers 35. Similarly, the metal ground plane layer 25 and metal signal layer 30 can be composed of one or multiple metal slots either unconnected or connected by a metal structure. Thus, in embodiments, the connected metal slots can form a single monolithic ground plane layer 25 and/or metal signal layer 30 and/or through-silicon via metal layer 35, respectively.

In the implementation of connected metal slots, e.g., connected ground plane layers 25, signal layers 30 and/or silicon via metal layers 35, one or more connecting vias is formed in the substrate 10 using the patterned resist of FIG. 1. The connecting vias are filled with the metal or metal alloy, during the deposition process of the through-silicon vias, to connect multiple metal slots of the respective structures 25, 30 and/or 35. For example, the metal slots forming the multiple through-silicon via metal layers 35 can be connected to form a monolithic, connected through-silicon via metal layer 35.

In embodiments, the connecting via can be multiple connecting vias, formed at different locations along the length of the one or more multiple slots forming the structures 25, 30, 35. The connecting vias are preferably formed at the ends of the metal slots; although the connecting via can be formed along any portion of the length of the metal slots forming each of the structures 25, 30, 35. In additional embodiments, the one or more connecting vias can be, for example, an orthogonal via that connects each of the metal slots of the respective structures, thereby forming a monolithic structure of metal slots. For example, the connecting via can connect plural metal slots of the silicon via metal layers 35, thus forming a single connected through-silicon via metal layer 35.

Figure 3:
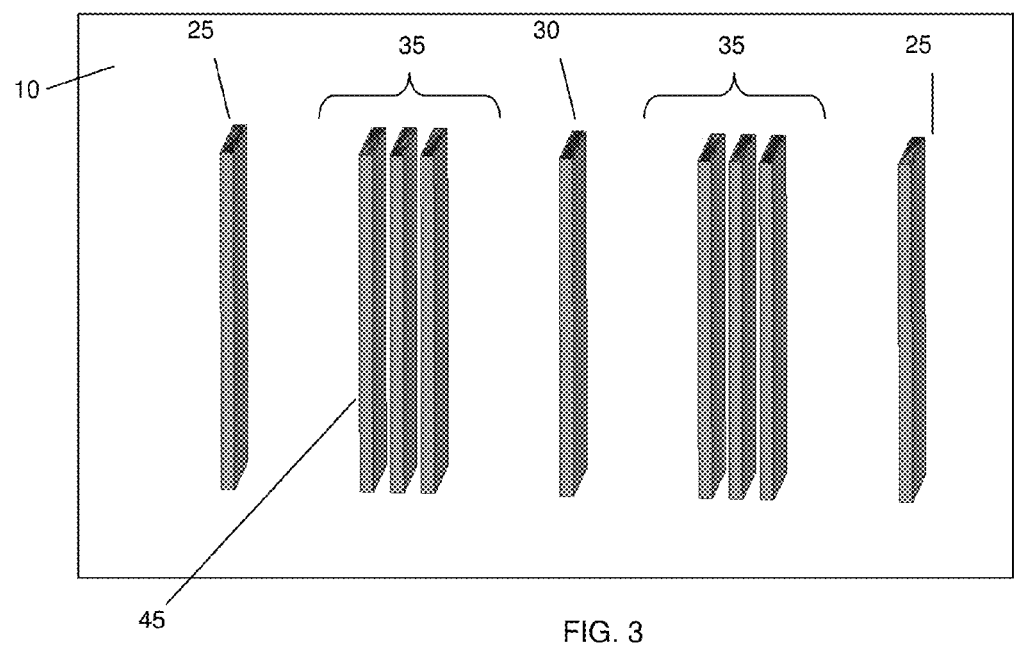
FIG. 3 shows a slow-wave coplanar waveguide structure in accordance with aspects of the invention.

FIG. 3 shows an exploded view of the structure of FIG. 2, in accordance with aspects of the invention. More specifically, FIG. 3 shows a signal layer 30 (composed of a single metal slot) formed between multiple floating silicon via metal layers 35, in the substrate 10. A ground plane layer 25 (composed of a single metal slot) is formed on both sides of the single metal signal layer 30, in the substrate 10. In embodiments, the multiple floating silicon via metal layers 35 are thus positioned between the metal signal layer 30 and the ground plane layer 25. In embodiments, the metal layers 25, 30 and 35 can be coated with an insulator layer 45, e.g., SiO$_2$. As should be understood, the metal layers 25, 30 and 35 are also formed in the same plane, in a coplanar configuration.

Figure 4:
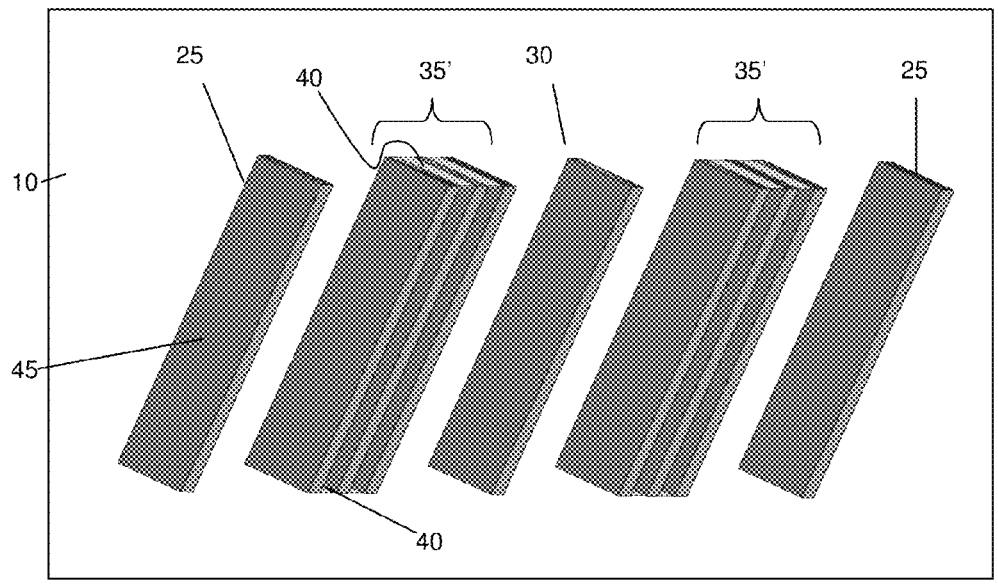
FIG. 4 shows a slow-wave coplanar waveguide structure in accordance with additional aspects of the invention.

FIG. 4 shows an exploded view of the structure of FIG. 1, with a connected through-silicon via metal layer 35', in accordance with aspects of the invention. More specifically, FIG. 4 shows multiple via metal slots connected by a metal connection 40, thereby forming a monolithic, connected through-silicon via metal layer 35'. FIG. 4 also shows a metal signal layer 30 (composed of a single metal slot) formed between the monolithic, connected through-silicon via metal layer 35', in the substrate 10. A ground plane layer 25 (composed of a single metal slot) is formed on both sides of the single metal signal layer 30, in the substrate 10. In this way, accordingly, the monolithic, connected through-silicon via metal layer 35' is positioned between the metal signal layer 30 and the ground plane layer 25. In embodiments, the metal layers 25, 30 and 35' can be coated with an insulator layer 45, e.g., SiO$_2$.

Capacitance and inductance of the CPW structure can be adjusted by, for example, (i) using a different number of slots in the connected through-silicon via metal layer 35', (ii) adjusting the distance (e.g., separation) between the connected through-silicon via metal layer 35' and the metal signal layer 30, and/or (iii) adjusting the number of connecting vias in the connected through-silicon via metal layer 35'. As should be understood, the metal layers 25, 30 and 35' are also formed in the same plane, in a coplanar configuration.

Figure 5A:
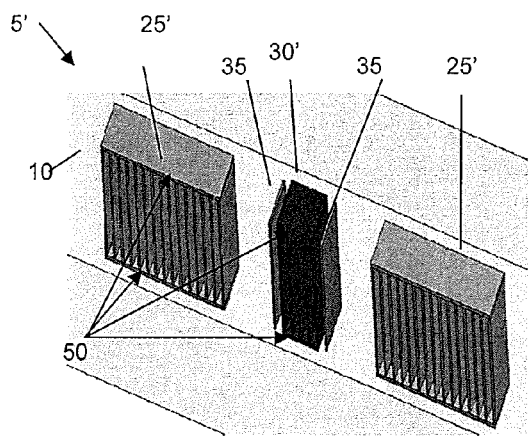
FIGS. 5A-5D show different slow-wave coplanar waveguide structures in accordance with aspects of the invention.

FIGS. 5A-5D show different slow-wave coplanar waveguide (CPW) structures in accordance with aspects of the invention. In each of these configurations, the metal slots are formed in a same plane, and are coplanar with one another. More specifically, FIG. 5A shows a CPW structure 5' comprising a single floating through-silicon via metal layer 35 on each side of a connected metal signal layer 30', formed in the substrate 10. As shown in FIG. 5A, the connected metal signal layer 30' comprises a plurality of metal slots connected by transverse metal slots 50, at both ends of the metal slots. Similarly, a ground plane layer 25' comprises a plurality of metal slots connected by connecting transverse metal slots 50. The single floating silicon via metal layer 35 is positioned between the connected metal signal layer 30' and the ground plane layer 25'.

Figure 5B:
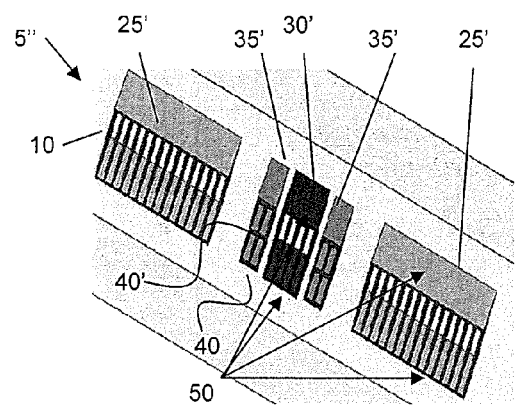

FIG. 5B shows a CPW structure 5" comprising a monolithic, connected through-silicon via metal layer 35' on both sides of the connected metal signal layer 30'. In embodiments, the monolithic, connected through-silicon via metal layer 35' comprises metal slots connected by the metal connection 40 and metal connection 40'. In embodiments, the metal connection 40' can be along a portion or entirely of a length of the metal slots of the through-silicon via metal layer 35'. In the latter implementation, the through-silicon metal layer 35' would be composed of a single metal layer, akin to a trench filled with metal. In this embodiment, the metal connection 40 is provided at both ends of the metal slots; whereas, the metal connection 40' is provided along a length of the metal slots. FIG. 5B further shows the connected metal signal layer 30', as well as a connected ground plane layer 25', both of which comprise a plurality of metal slots connected by connecting transverse metal slots 50.

Figure 5C:
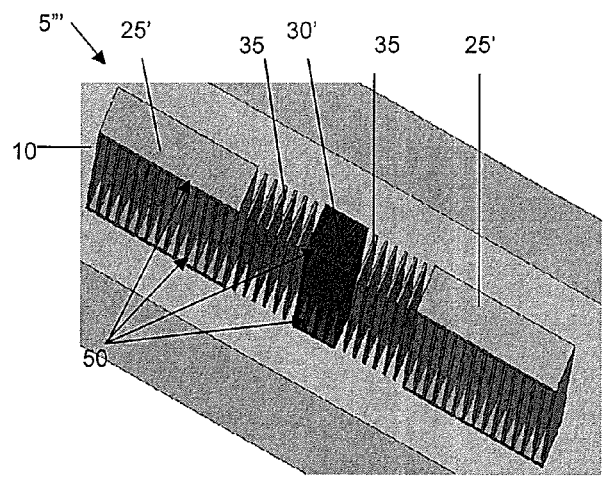

FIG. 5C shows a CPW structure 5''' comprising multiple (six) slots forming the floating silicon via metal layer 35 on each side of the connected metal signal layer 30', formed in the substrate 10. As shown in FIG. 5C, the connected metal signal layer 30' comprises a plurality of metal slots connected by transverse metal slots 50, at both ends of the metal slots. The total thickness of the connected metal signal layer 30' may be, for example, 9 microns; whereas, the total spacing between the ground plane layer 25' and the metal signal layer 30' can be about 81 microns, with each slot forming the floating silicon via metal layer 35 being about 3 microns. The present invention, though, contemplates other dimensions, depending on the desired capacitance. The ground plane layer 25' comprises a plurality of metal slots connected by the metal slots 50, at both ends.

Figure 5D:
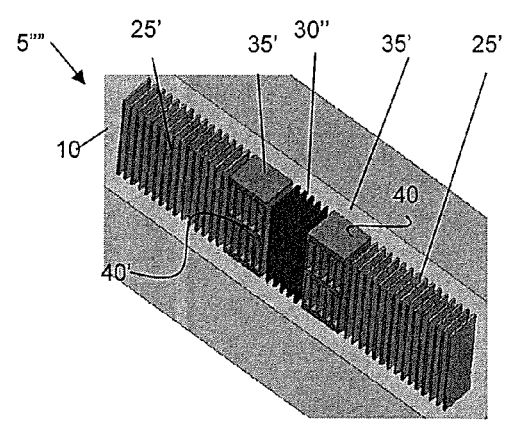

FIG. 5D shows a CPW structure 5'''' comprising a monolithic, connected through-silicon via metal layer 35' on both sides of a plurality of floating metal slots, e.g., metal signal layers 30''. In embodiments, the monolithic, connected through-silicon via metal layer 35' comprises metal slots connected by the metal connection 40 and the metal connection 40'. FIG. 5D further shows the connected metal signal layer 30", as well as the connected ground plane layer 25', composed of a plurality of floating metal slots. The connected metal signal layer 30" comprises a plurality of metal slots connected by the connecting transverse metal slots 50, as shown in FIG. 5C.

As should now be understood by the present invention, inductance and capacitance of the CPW structure can be tuned by varying the dimensions and spacing of the metal slots composing the through-silicon via metal layer 35. For example, adding additional slots between the signal layer 30 and the ground plane layers 25 will increase the capacitance of the CPW structure. Additionally, decreasing the spacing between the metal slots of the through-silicon via metal layer 35 and the signal layer 30 will increase the capacitance of the CPW structure and reduce the inductance of the CPW structure. Moreover, by providing additional connections between the metal slots of the silicon metal layer 35 will also increase the capacitance of the CPW structure. In this way, for example, (i) the capacitance of the CPW structure of FIG. 5B is greater than the capacitance of the CPW structure of FIG. 5A;

(ii) the capacitance of the CPW structure of FIG. 5C is greater than the capacitance of the CPW structure of FIG. 5B; and (iii) the capacitance of the CPW structure of FIG. 5D is greater than the capacitance of the CPW structure of FIG. 5C.

The characteristic impedance of the CPW structures can also be tuned. For example, the characteristic impedance of the CPW structures can be tuned by changing the separation distance between the signal layer and the ground plane.

Moreover, as should be understood by those of skill in the art, the CPW structure can be tuned, even though it is of a fixed electrical length between the ground plane layer and the signal layer. The capacitance and characteristic impedance of the CPW structure of the present invention, for example, can be tuned by adjusting the through-silicon via filled with metal, which is positioned between a signal layer and a ground plane layer formed in substrate. By way of example, the adjusting comprises adjusting a spacing between the through-silicon via filled with metal and the signal layer. By way of further example, the adjusting comprises providing at least one connecting via filled with metal connecting a plurality of the through-silicon vias filled with metal. In still a further example, the adjusting comprise adjusting an amount of metal in the through-silicon via.

Figure 6:
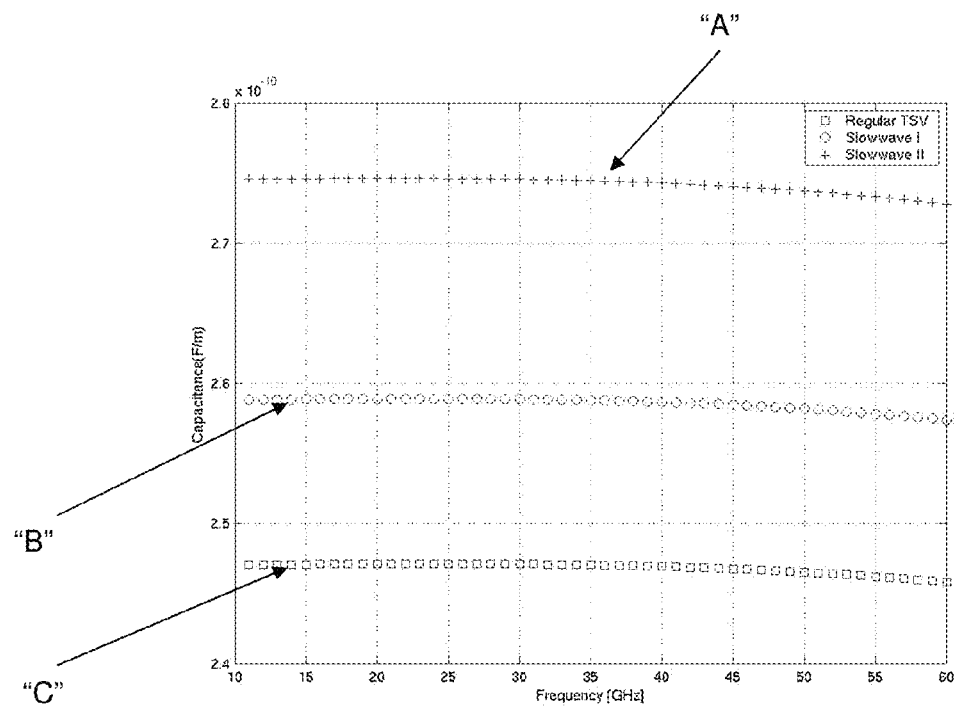
FIGS. 6 and 7 show performance/comparison graphs of slow-wave coplanar waveguide structures in accordance with aspects of the invention.
Figure 7:
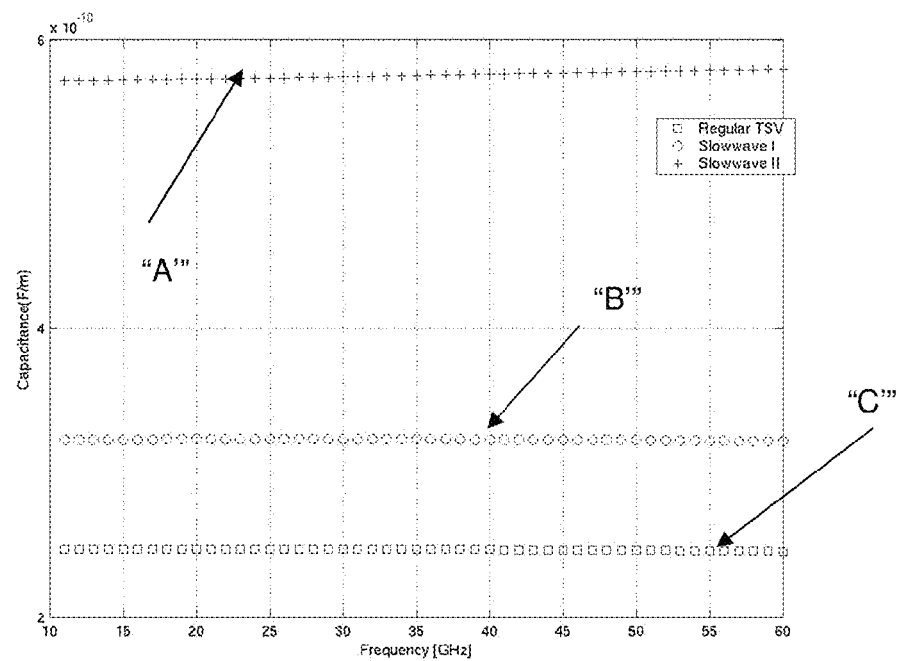

FIGS. 6 and 7 show performance graphs of structures in accordance with aspects of the invention. Specifically, the graphs shown in FIGS. 6 and 7 are comparison charts of capacitance vs. frequency of several structures. In particular, in the graph of FIG. 6, line "A" is representative, for example, of a CPW structure with six floating through-silicon via metal lines between the signal layer and the ground plane layer; whereas, line "B" is representative, for example, of the CPW structure shown in FIG. 3. i.e., three metal slots between the signal layer and the ground plane layer. Line "C" is representative of a conventional structure, e.g., CPW structure with a signal layer and ground plane.

As shown in FIG. 6, the capacitance of the structure representative by line "A" is greater than the capacitance of the structure represented by line "B", over a frequency of at least 10 GHz to 60 GHz (with this trend continuing over a broad range of frequencies). This is due to the fact that the structure represented by line "A" includes more metal between the signal layer and the ground plane layer, e.g., six metal slots compared to three metal slots. Also, the capacitance of the structure representative by line "B" is greater than the capacitance of the conventional structure represented by line "C", over a frequency of at least 10 GHz to 60 GHz (with this trend continuing over a broad range of frequencies).

FIG. 7 shows a comparison of capacitance vs. frequency for CPW structures of connected through-silicon via metal layers and a conventional CPW structure. In particular, in the graph of FIG. 7, line "A'" is representative, for example, of a CPW structure with six connected floating through-silicon via metal lines between the signal layer and the ground plane layer; whereas, line "B'" is representative, for example, of the CPW structure shown in FIG. 4. i.e., three connected metal slots between the signal layer and the ground plane layer. Line "C'" is representative of a conventional structure, e.g., CPW structure with a signal layer and ground plane.

As shown in FIG. 7, the capacitance of the structure representative by line "A'" is greater than the capacitance of the structure represented by line "B'", over a frequency of at least 10 GHz to 60 GHz (with this trend continuing over a broad range of frequencies). This is due to the fact that the structure represented by line "A'" includes more metal between the signal layer and the ground plane layer, e.g., six connected metal slots compared to three metal slots. Also, the capacitance of the structure representative by line "B'" is greater than the capacitance of the conventional structure represented by line "C'", over a frequency of at least 10 GHz to 60 GHz (with this trend continuing over a broad range of frequencies).

Figure 8:
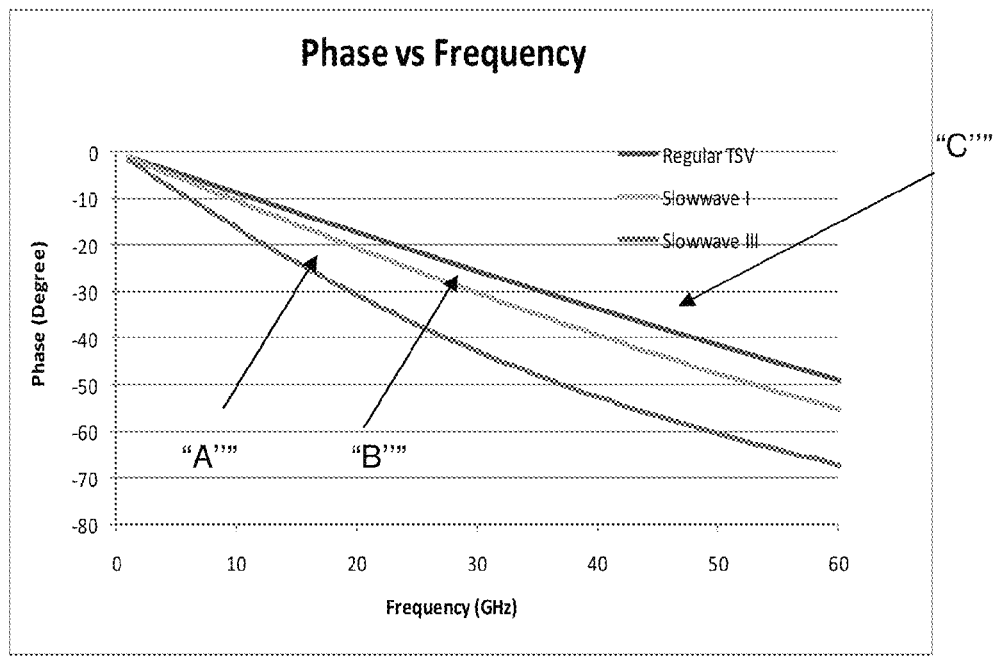
FIG. 8 shows a graph of frequency vs. phase change for slow-wave coplanar waveguide structures in accordance with aspects of the invention.

FIG. 8 shows a graph of frequency vs. phase change for slow-wave coplanar waveguide structures in accordance with aspects of the invention. More specifically, FIG. 8 shows three CPW structures represented by lines "A''", "B''" and "C''". Line "A''" represents a CPW structure with three floating slots forming the through-silicon vias, line "B''" represents a CPW structure with one slot forming the through-silicon vias and line "C''" represents a conventional CPW structure, where each CPW structure has a fixed length of 157 um. As shown in FIG. 8, the CPW structure represented by line "A''" has the greatest phase change of about 67° at 60 GHz The CPW structure represented by line "B''" has a phase change about 54° at 60 GHz. In comparison, though, the conventional structure represented by line "C''" has the smallest phase change of 49° at 60 GHz. The differences in the phase changes of the CPW structures represented by lines "A''" and "B''" are a result of the configuration of the silicon through vias positioned between the ground plane layer 25 and the signal layer 30.

The CPW structures of the present invention can be implemented in many different types of devices such as, for example, a bandpass filter and Wilkinson power dividers (also referred to as Wilkinson power splitters). The CPW structures provide the ability to operate, for example, the Wilkinson power dividers at different frequencies (i.e. variable electrical lengths) for a fixed physical length. This is accomplished by adjusting the dimensions, configuration and/or spacing of the through-silicon vias of the present invention.

As should be understood, Wilkinson power dividers (WPD) are used extensively in phased array radar applications, and also in other RF applications, to split power from one line to two lines (or, alternatively, the combine power from two lines to one line). Typically, a millimeter wave (MMW) WPD is implemented in a horizontal manner in the metal layers in the back-end-of-line (BEOL) processing of integrated circuit chips. More specifically, a WPD commonly includes an input wire that splits into two legs, a respective output at the end of each leg opposite the split, and a resistor connected between the two outputs. By definition, the legs of a WPD are of a specified length (e.g., one-quarter wavelength, i.e., λ/4) and the resistor is of a specified resistance (e.g., 2Zo), which results in the input and the two outputs all having a matched characteristic impedance (Zo). Moreover, the resistor isolates the two outputs from one another. In this way, a WPD improves over simple "T" and "Y" junctions by providing matching impedance at the input and output ports, and by providing isolation between the two output ports. However, since the legs of a WPD must be of a particular length, there is a lower limit to the minimum footprint (e.g., the area when viewed in plan view) that can be achieved for adequate divider performance at a given frequency in a conventional metal-dielectric BEOL stack-up. That is to say, a large amount of chip space is required for a WPD when the legs of a WPD are implemented as horizontal traces in wiring levels above the wafer. As such, the necessary minimum size footprint of a conventionally oriented WPD negatively affects the overall cost of a phased array system. This can be overcome by implementing the CPW structures of the present invention, due to the fact that a variable electrical length can be achieved using the silicon through vias of the present invention.

Figure 9:
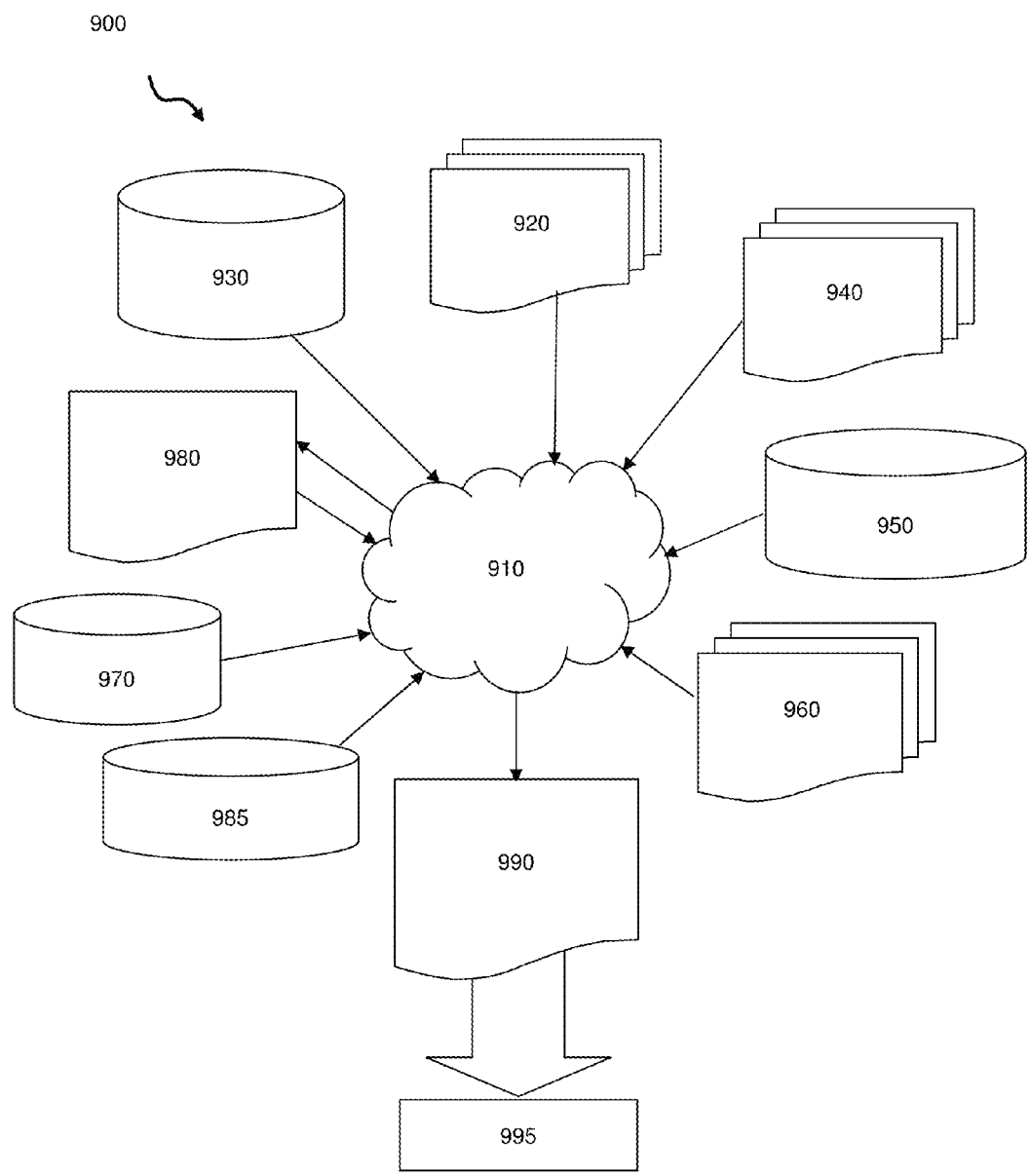
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a coplanar waveguide structure, comprising:
   forming at least one ground plane layer in a substrate;
   forming a signal layer in the substrate, in a same plane layer as the at least one ground plane layer; and
   forming at least one continuous metal filled through-silicon via between the at least one ground plane layer and the signal layer, the continuous metal filled through-silicon via extending parallel to and for a length of the at least one ground plane layer and the signal layer, wherein the at least one continuous metal filled through-silicon via is electrically insulated from the signal layer.

2. The method of claim 1, wherein the at least one through-silicon via is a plurality of through-silicon vias formed in the substrate on both sides of the signal layer, and separating the signal layer from the ground plane layer.

3. The method of claim 2, wherein the plurality of through-silicon vias are formed as metal filled slots which are connected together by connecting vias filled with metal.

4. A method of forming a coplanar waveguide structure, comprising:
   forming at least one ground plane layer in a substrate;
   forming a signal layer in the substrate, in a same plane layer as the at least one ground plane layer; and
   forming at least one continuous metal filled through-silicon via between the at least one ground plane layer and the signal layer, the continuous metal filled through-silicon via extending parallel to and for a length of the at least one ground plane layer and the signal layer, wherein:
   the at least one through-silicon via is a plurality of through-silicon vias formed in the substrate on both sides of the signal layer, and separating the signal layer from the ground plane layer;
   the plurality of through-silicon vias are formed as metal filled slots which are connected together by connecting vias filled with metal; and
   the connecting vias are formed at ends of the slots.

5. The method of claim 3, wherein the connecting vias are formed along a length of the metal filled slots.

6. The method of claim 1, wherein the at least one ground plane layer and the signal layer are formed of metal slots.

7. The method of claim 6, wherein at least one of the at least one ground plane layer and the signal layer are formed of a plurality of slots filled with metal.

8. The method of claim 7, further comprising forming connecting vias filled with metal to connect the plurality of slots filled with metal that form at least one of the at least one ground plane layer and the signal layer.

9. The method of claim 1, wherein the at least one ground plane layer, the signal layer and the at least one through-silicon via are formed by etching vias in the substrate and filling the vias with metal, in a same deposition process.

10. The method of claim 1, wherein the at least one ground plane layer, the signal layer and the at least one metal filled through-silicon via are coated with an insulator material, by depositing the insulator material in a via prior to metal deposition.

11. The method of claim 1, further comprising adjusting an amount of metal in the at least one metal filled through-silicon via and a spacing between the at least one metal filled through-silicon via and the signal layer.

12. A method of tuning a coplanar waveguide structure, comprising tuning at least one of a capacitance and characteristic impedance of the coplanar waveguide structure by adjusting a plurality of continuous through-silicon vias filled with metal, positioned between a signal layer and a ground plane layer formed in a substrate, wherein the adjusting comprises providing at least one connecting via filled with metal connecting the plurality of continuous through-silicon vias filled with the metal, and wherein the at least one connecting via is formed at ends of the plurality of continuous through-silicon vias filled with metal, and the at least one connecting via connects each of the plurality of continuous through-silicon vias filled with metal.

13. The method of claim 12, wherein the adjusting further comprises adjusting the spacing between the metal-filled plurality of continuous through-silicon vias and the signal layer.

14. The method of claim 12, wherein the adjusting further comprises adjusting an amount of metal in the metal filled plurality of continuous through-silicon vias.

15. The method of claim 12, wherein the tuning further comprises at least one of:
changing an amount of a separation between the signal layer and the plurality of continuous through-silicon vias filled with metal;
changing a thicknesses of the plurality of continuous through-silicon vias filled with metal; and
adding one or more metal slots to the plurality of continuous through-silicon vias filled with metal.

16. A slow wave coplanar waveguide (CPW) structure, comprising:
a signal layer;
at least one ground plane layer adjacent to the signal layer; and
at least one continuous through-silicon via filled with metal extending parallel to and for a length of the at least one ground plane layer and the signal layer, the at least one continuous through-silicon via positioned between the signal layer and the at least one ground plane layer, wherein the at least one continuous through-silicon via is electrically insulated from the signal layer.

17. The structure of claim 16, wherein the at least one through-silicon via filled with metal is a plurality of metal filled slots.

18. The structure of claim 17, further comprising connecting vias filled with metal, the connecting vias connecting the plurality of metal filled slots along a length thereof.

19. A hardware description language (HDL) design structure tangibly embodied in a machine-readable data storage medium, said HDL design structure comprising elements that when processed in a computer-aided design system comprising at least a hardware component of a lithography machine that generates a machine-executable representation of a coplanar waveguide structure, wherein the HDL design structure comprises:
a signal layer;
at least one ground plane layer adjacent to the signal layer; and
at least one continuous through-silicon via filled with metal extending parallel to and for a length of the at least one ground plane layer and the signal layer, the at least one continuous through-silicon via positioned between the signal layer and the at least one ground plane layer, wherein the at least one continuous through-silicon via is electrically insulated from the signal layer.

20. The design structure of claim 19, wherein the design structure comprises a netlist.

21. The design structure of claim 19, wherein the design structure resides on storage medium as a data format used for the exchange of layout data of integrated circuits.

22. The design structure of claim 19, wherein the design structure resides in a programmable gate array.

* * * * *